United States Patent
Jeong et al.

(10) Patent No.: US 7,081,926 B2
(45) Date of Patent: Jul. 25, 2006

(54) AUTOMATIC GAIN CONTROL APPARATUS FOR VIDEO SIGNAL AND ADJUSTING METHOD THEREOF

(75) Inventors: Hong-seok Jeong, Euijeongbu (KR); Tae-don Hwang, Suwon (KR)

(73) Assignee: Samsung Electronics Co., Ltd., Gyunggi-do (KR)

(*) Notice: Subject to any disclaimer, the term of this patent is extended or adjusted under 35 U.S.C. 154(b) by 547 days.

(21) Appl. No.: 10/612,978

(22) Filed: Jul. 7, 2003

(65) Prior Publication Data
US 2004/0004673 A1 Jan. 8, 2004

(30) Foreign Application Priority Data
Jul. 8, 2002 (KR) ............................... 2002-39458

(51) Int. Cl.
*H04N 5/52* (2006.01)

(52) U.S. Cl. .................................................... 348/678

(58) Field of Classification Search ................ 348/678, 348/679, 229, 255, 725, 726, 731; 455/136, 455/138, 240.1, 245.1; 375/345, 245, 316
See application file for complete search history.

(56) References Cited

U.S. PATENT DOCUMENTS

| | | | | |
|---|---|---|---|---|
| 4,780,909 A | * | 10/1988 | Sakashita et al. | 455/161.3 |
| 5,175,883 A | * | 12/1992 | Ueno | 455/242.2 |
| 5,745,847 A | * | 4/1998 | Matsuo | 455/234.1 |
| 6,005,640 A | * | 12/1999 | Strolle et al. | 348/726 |
| 6,070,062 A | * | 5/2000 | Yoshida et al. | 455/234.1 |
| 6,107,878 A | * | 8/2000 | Black | 330/129 |
| 6,348,955 B1 | * | 2/2002 | Tait | 348/731 |
| 6,377,316 B1 | * | 4/2002 | Mycynek et al. | 348/731 |
| 6,650,878 B1 | * | 11/2003 | Abe et al. | 455/232.1 |
| 6,771,719 B1 | * | 8/2004 | Koyama et al. | 375/345 |
| 6,965,656 B1 | * | 11/2005 | Koizumi | 375/345 |
| 6,996,386 B1 | * | 2/2006 | Yamanaka | 455/234.2 |

* cited by examiner

*Primary Examiner*—Paulos M. Natnael
(74) *Attorney, Agent, or Firm*—Sughrue Mion, PLLC

(57) ABSTRACT

An automatic gain control apparatus for a video signal and adjusting method thereof, An RF(Radio Frequency) automatic gain control apparatus receives a reproduced video signal from a demodulator, controlling a gain of an RF amplifier according to the reproduced video signal. An IF(Intermediate Frequency) automatic gain control apparatus receives a reproduced video signal from a demodulator, controlling a gain of an IF amplifier according to the reproduced video signal. In the meantime, a RF automatic gain control compensating unit detects an input signal provided to the IF amplifier, checking whether the detected IF input signal meets a reference level, controlling for raising a voltage of the RF automatic gain control apparatus if the detected IF input signal is lower than the reference level, controlling for lowering a voltage of the RF automatic gain control apparatus if the detected IF input signal is higher than the reference level.

13 Claims, 5 Drawing Sheets

AUTOMATIC GAIN CONTROL APPARATUS FOR VIDEO SIGNAL AND ADJUSTING METHOD THEREOF

BACKGROUND OF THE INVENTION

1. Field of the Invention

The present invention relates to an automatic gain control apparatus for a video signal and an adjusting method thereof, and more particularly to an automatic gain control apparatus which does not need initial AGC (Automatic Gain Control) adjustment and an adjusting method thereof.

The present application is based on Korean Patent Application No. 2002-0039458, filed Jul. 8, 2002, which is incorporated herein by reference in its entirety.

2. Description of the Related Art

A TV receiver automatically controls a gain of a receiver according to intensity of a received radio wave, and has an AGC (Automatic Gain Control) circuit for obtaining a constant video signal detecting output without distortion.

FIG. 1 is a conventional block diagram of an automatic gain control circuit for a TV receiver.

As shown in FIG. 1, the conventional automatic gain control circuit (AGC circuit) for a TV receiver comprises a tuner 12, a pre-filter 13, a SAW (Surface Acoustic Wave) filter 14, an IF(Intermediate Frequency) amplifier 15, a demodulator 16, an IF AGC 17 and a RF (Radio Frequency) AGC 18.

High frequency (RF) signal from a predetermined channel selected by the tuner 12, is input through an antenna 11. An RF amplifier 12b amplifies the input high frequency signal, converting the same into an intermediate frequency (IF) signal.

The IF signal passes through the pre-filter 13 and the SAW filter 14, and is amplified at the IF amplifier 15.

The amplified IF signal is demodulated at the demodulator 16, and is output in the form of a composite video signal.

A RF AGC 18 and an IF AGC 17 detect the composite video signal demodulated at and provided from the demodulator 16, controlling the RF amplifier 12b and the IF amplifier 15 for obtaining a predetermined gain.

In the case that the intensity of an input signal is strong, i.e., if it is over a predetermined degree, the RF AGC 18 controls an amplifying gain at a RF terminal, while controlling to obtain a constant gain at an IF terminal without suppressing the gain.

In the case that the intensity of an input signal is weak, i.e., if it is below a predetermined degree, the IF AGC 17 controls the amplifying gain at the IF terminal, while controlling to obtain a constant gain at the RF terminal without amplifying the gain.

In a conventional automatic gain control circuit for a TV receiver, the RF AGC 18 and the IF AGC 17 detect a demodulated composite video signal, and control the RF amplifier 12b and the IF amplifier 15, respectively, to maintain a constant voltage gain.

FIGS. 2A and 2B are graphs representing a RF AGC curve for the conventional automatic gain control circuit of a TV receiver as shown in FIG. 1.

As shown in FIGS. 2A and 2B, if a level A of a RF input level is high, an AGC voltage B fit for the relevant level in the AGC curve, is fed back to the IF AGC 17 and the RF AGC 18.

An AGC constant determines an operation point of the AGC graph. In the case that the AGC constant becomes large, the AGC graph moves to the right, showing a saturation phenomenon of a signal, while in the case that the AGC constant becomes small, the AGC graph moves to the left, causing a noise in a signal.

The following mathematical equations 1 define the AGC curve.

$$B = -G*A \quad \text{[Equation 1]}$$

where, B is an AGC voltage, G is an AGC constant, A is a CVBS(Composite Video Baseband Signal) signal level, $$O = (K+B)*I \quad \text{[Equation 2]}$$

where, O is an IF/RF amplifier output, K is an amplifying rate of amplifier, and I is an input signal of amplifier.

Further, in the case that an amplifying characteristic deteriorates due to an error during part manufacturing process of the RF amplifier or other reasons, and a signal is insufficiently amplified, a weak signal passes through the pre-filter 13, the SAW filter 14, the IF amplifier 15, the demodulator 16, whereby a weak composite signal is output.

When detecting the weak composite signal, the AGC circuit raises an amplifying rate of the IF amplifier, instead of the insufficiently amplifying RF amplifier, to form 1 Vpp signal.

In the case that an amplifying characteristic deteriorates due to an error during part manufacturing process of the RF amplifier or other reasons, and a signal is excessively amplified, the AGC circuit lowers an amplifying rate of the IF amplifier, forming 1 Vpp signal.

Under such circumstance, a weak signal vulnerable to noise passes through the pre-filter 13, the SAW filter 14, the IF filter 15, whereby the noise characteristic of the signal deteriorates or the signal is excessively amplified, causing a saturation phenomenon.

Therefore, in the case that an amplifying characteristic deteriorates due to an error during part manufacturing process of the RF amplifier or other reasons, and a signal is insufficiently amplified, an automatic gain control circuit for adjusting a control voltage of the RF AGC, is required.

SUMMARY OF THE INVENTION

An object of the invention is to solve at least the above problems and/or disadvantages and to provide at least the advantages described hereinafter.

Accordingly, it is an object of the present invention to solve the foregoing problems by providing an automatic gain control apparatus for a video signal not requiring initial AGC adjustment by detecting a signal level of the IF input terminal, and controlling the signal in advance to become a predetermined level.

The above described object is realized by providing an automatic gain control apparatus for a video signal comprising: a RF amplifier for receiving signals of a frequency band from a predetermined channel, amplifying a high frequency signal among those received signals, converting the high frequency signal into an intermediate frequency (IF) signal; an IF amplifier for receiving the intermediate frequency signal, amplifying the signal by a predetermined amplifying rate; a demodulator for demodulating the IF signal from the IF amplifier, outputting a reproduced video signal; a RF automatic gain control apparatus and an IF automatic gain control apparatus for receiving the video signal reproduced by the demodulator, controlling a gain of the RF amplifier and a gain of the IF amplifier according to the reproduced video signal, respectively; a RF automatic gain control compensating unit for detecting an IF input signal provided to the IF amplifier, checking whether the detected IF input signal meets a reference level, controlling for raising a voltage of the RF automatic gain control apparatus if the detected IF input signal is lower than the reference level, controlling for lowering a voltage of the RF automatic gain control apparatus if the detected IF input signal is higher than the reference level.

In the case that the reproduced video signal is smaller than a predetermined value and the input signal is lower than the reference level, the RF automatic gain control apparatus raises an AGC constant, thereby making an output voltage higher compared with an input voltage of the RF automatic gain control apparatus.

In the meantime, in the case that the reproduced video signal is smaller than a predetermined value and the input signal meets the reference level, the IF automatic gain control apparatus is adjusted.

Further, in the case that the reproduced video signal is smaller than a predetermined value and the input signal is higher than the reference level, the RF automatic gain control apparatus lowers its AGC constant, thereby forming an output voltage low compared with an input voltage of the RF automatic gain control apparatus.

Still further, in the case that the reproduced video signal exceeds a predetermined value, the IF automatic gain control apparatus adjusts its AGC constant.

In the case that the reproduced video signal exceeds a predetermined value and the input signal is lower than the reference level, the RF automatic gain control apparatus raises its AGC constant, adjusting an AGC constant of the IF automatic gain control apparatus.

Further, in the case that the reproduced video signal exceeds a predetermined value and the input signal is higher than the reference level, the RF automatic gain control apparatus lowers its AGC constant, thereby forming an output voltage low compared with an input voltage of the RF automatic gain control apparatus, and an AGC constant of the IF automatic gain control apparatus is adjusted.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENT

The following detailed description is presented according to a preferred embodiment of the invention in reference to the accompanying drawings.

Figure 1:
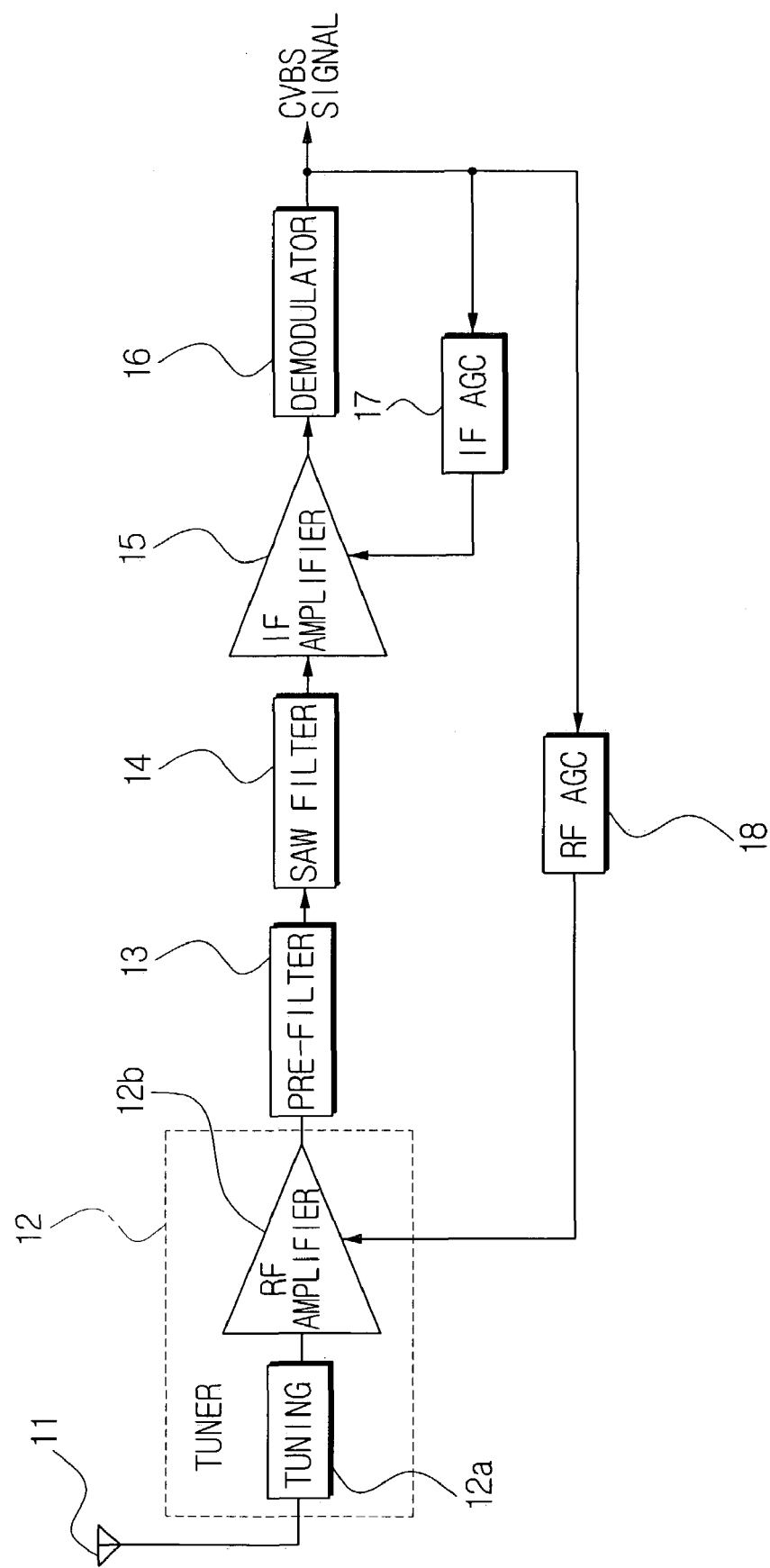
FIG. 1 is a block diagram of a conventional automatic gain control circuit for a TV receiver.
Figure 2A:
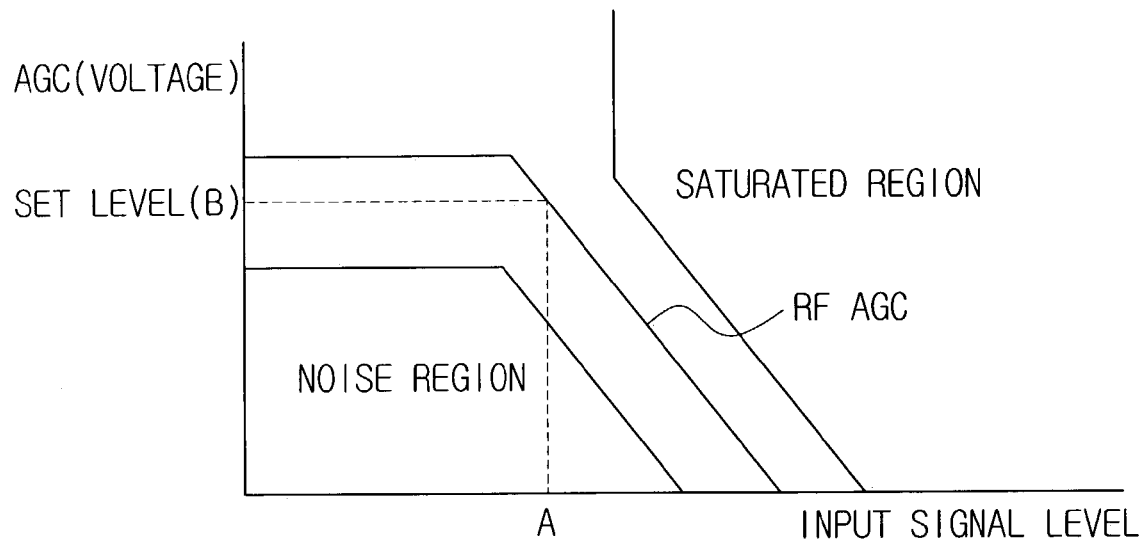
FIG. 2A is a graph representing a RF AGC curve for a conventional automatic gain control circuit of a TV receiver as shown in FIG. 1.
Figure 2B:
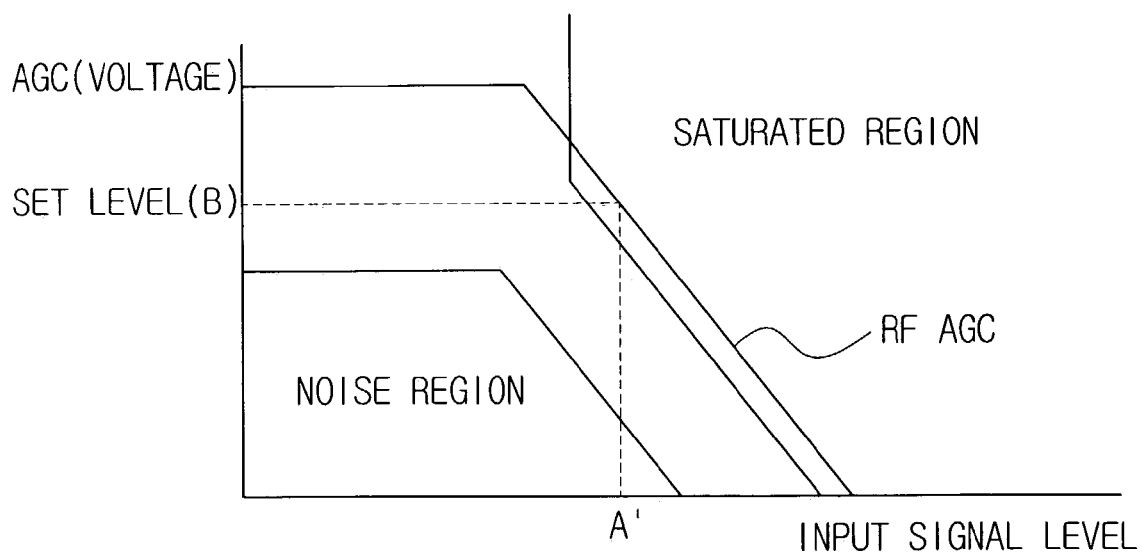
FIG. 2B is a graph representing a RF AGC curve upon malfunction for a conventional automatic gain control circuit of a TV receiver as shown in FIG. 1.
Figure 3:
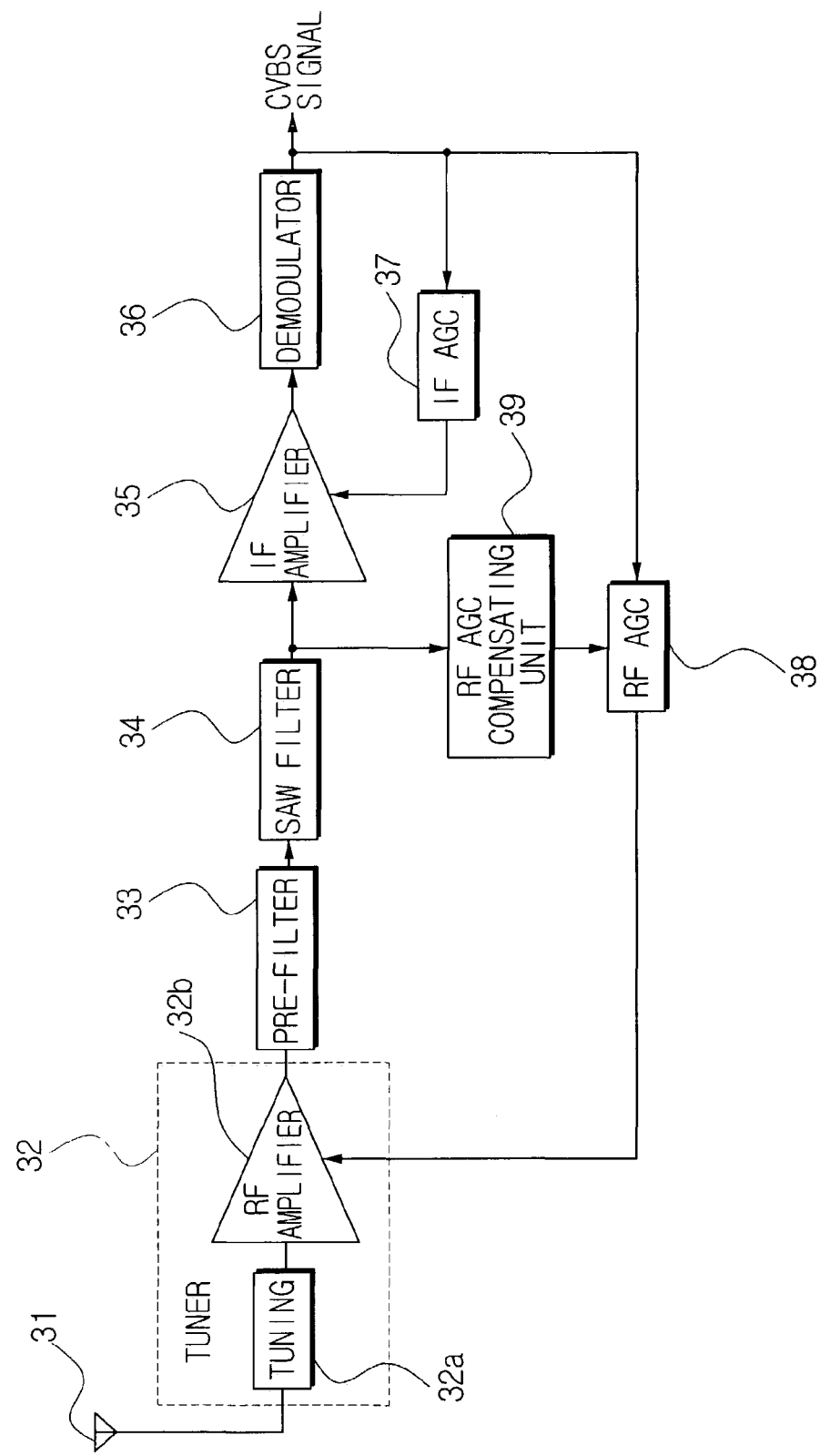
FIG. 3 is a block diagram of an automatic gain control apparatus for a video signal according to the present invention.

FIG. 3 is a block diagram of an automatic gain control apparatus for a video signal according to the present invention. As shown in FIG. 3, the automatic gain control apparatus for a video signal comprises a tuner 32, a pre-filter 33, a SAW (Surface Acoustic Wave) filter 34, an IF (Intermediate Frequency) amplifier 35, a demodulator 36, an IF AGC 37, a RF (Radio Frequency) AGC 38 and a RF AGC compensating unit 39.

The tuner 32 selects a RF television signal in a frequency band from a predetermined channel (32a), and the RF amplifier 32b installed within the tuner 32 amplifies the selected RF television signal, converting the amplified signal into an IF signal, outputting the same.

At the moment, the television signal amplified by the RF amplifier 32b is input to the pre-filter 33, the pre-filter 33 compensates for an inserting loss due to the SAW filter 34 connected at a rear end of the pre-filter 33, outputting the compensated signal to the SAW filter 34.

The SAW filter 34, a filter using a surface acoustic wave, eliminates other unnecessary frequency component except an IF band of an input signal.

The IF amplifier 35 amplifies the IF signal that passes through the SAW filter 34 by a predetermined amplifying rate.

The demodulator 36 demodulates an output signal from the IF amplifier 35, outputting a CVBS (Composite Video Baseband Signal: referred to as a composite video signal hereinafter), a demodulated video signal.

The IF AGC 37 outputs an IF AGC voltage for controlling a gain of the IF amplifier 35. Then, the IF amplifier 35 amplifies an IF television signal up to a predetermined amplitude according to a control voltage of the IF AGC 37.

The RF AGC 38 outputs a RF AGC voltage for controlling an optimum gain of the RF amplifier.

The RF AGC compensating unit 39 detects an input level of the IF signal input to the IF amplifier 35, checks whether the input level meets a predetermined level established in advance.

The RF AGC compensating unit 39 controls for raising a voltage of the RF AGC 38 in the case that the detected IF input signal is lower than a reference level, and controls for lowering a voltage of the RF AGC 38 in the case that the detected IF input signal is higher than the reference level.

The RF AGC 38 checks whether a level of the reproduced composite video signal meets 1 Vpp.

If the level of the composite video signal does not meet 1 Vpp, the following process is carried out.

1) In the case that an input signal is lower than a reference level, the RF AGC 38 raises its AGC constant, making an output voltage higher compared with an input voltage of the RF AGC circuit.

2) In the case that an input signal meets a reference level, the IF AGC circuit is adjusted and tuned.

3) In the case that an input signal is higher than a reference level, the RF AGC 38 lowers its AGC constant, making an output voltage lower compared with an input voltage of the RF AGC circuit.

In the meantime, if the level of the composite video signal exceeds 1 Vpp, the following process is carried out.

4) In the case that an input signal is lower than a reference level, the AGC constant of the RF AGC circuit is raised and the IF AGC circuit is adjusted and tuned.

5) In the case that an input signal meets a reference level, the IF AGC circuit is adjusted and tuned.

6) In the case that an input signal is higher than a reference level, the AGC constant of the RF AGC circuit is lowered and the output voltage is lowered compared with the input voltage of the RF AGC circuit, and the IF AGC circuit is adjusted and tuned.

Therefore, the RF AGC 38 controls such that the RF AGC voltage is raised up to an IF AGC voltage upon maximum allowed input where the RF amplifier 32b is not saturated.

Figure 4A:
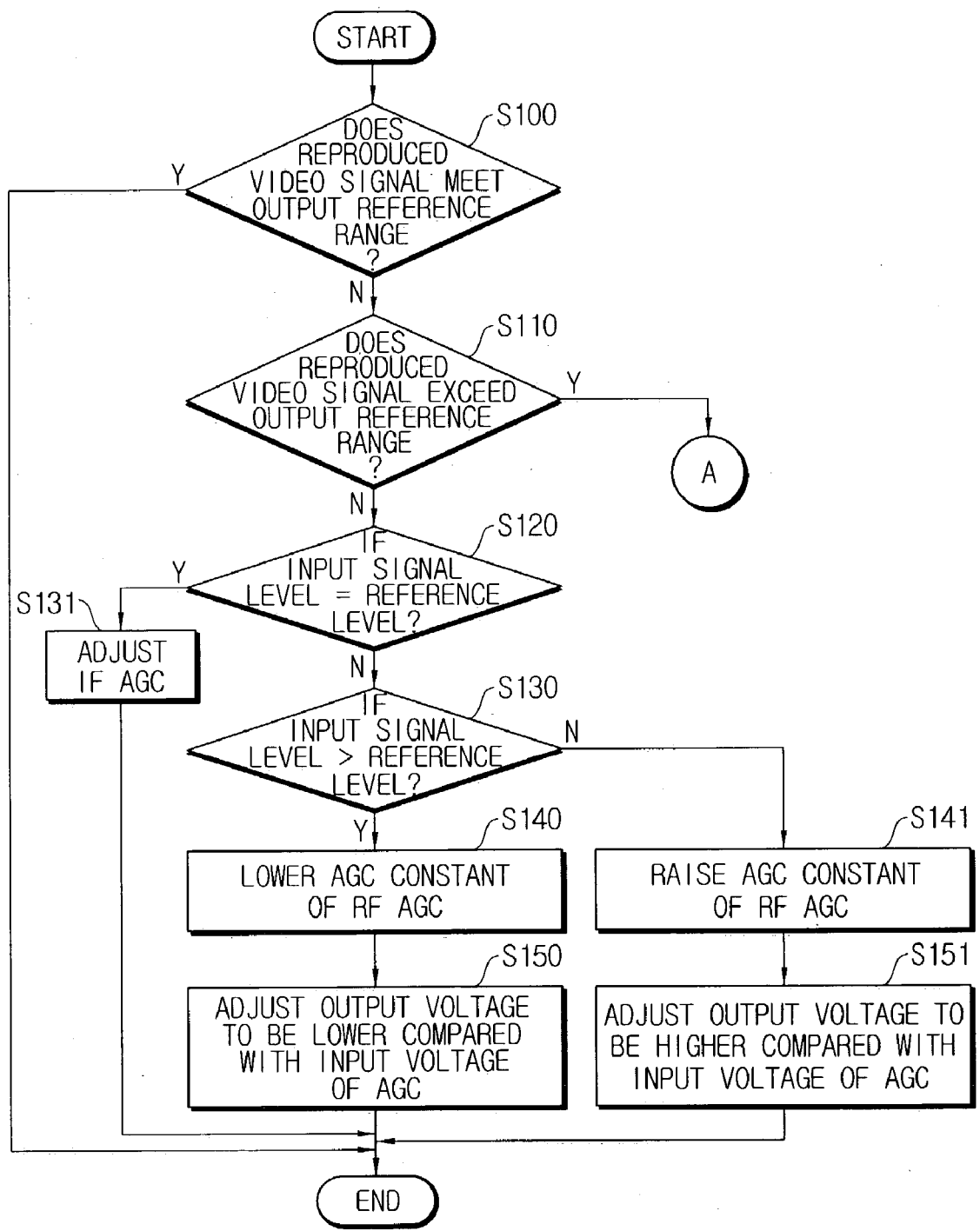
FIGS. 4A and 4B are flowcharts illustrating an adjusting method of an automatic gain control apparatus according to the present invention.
Figure 4B:
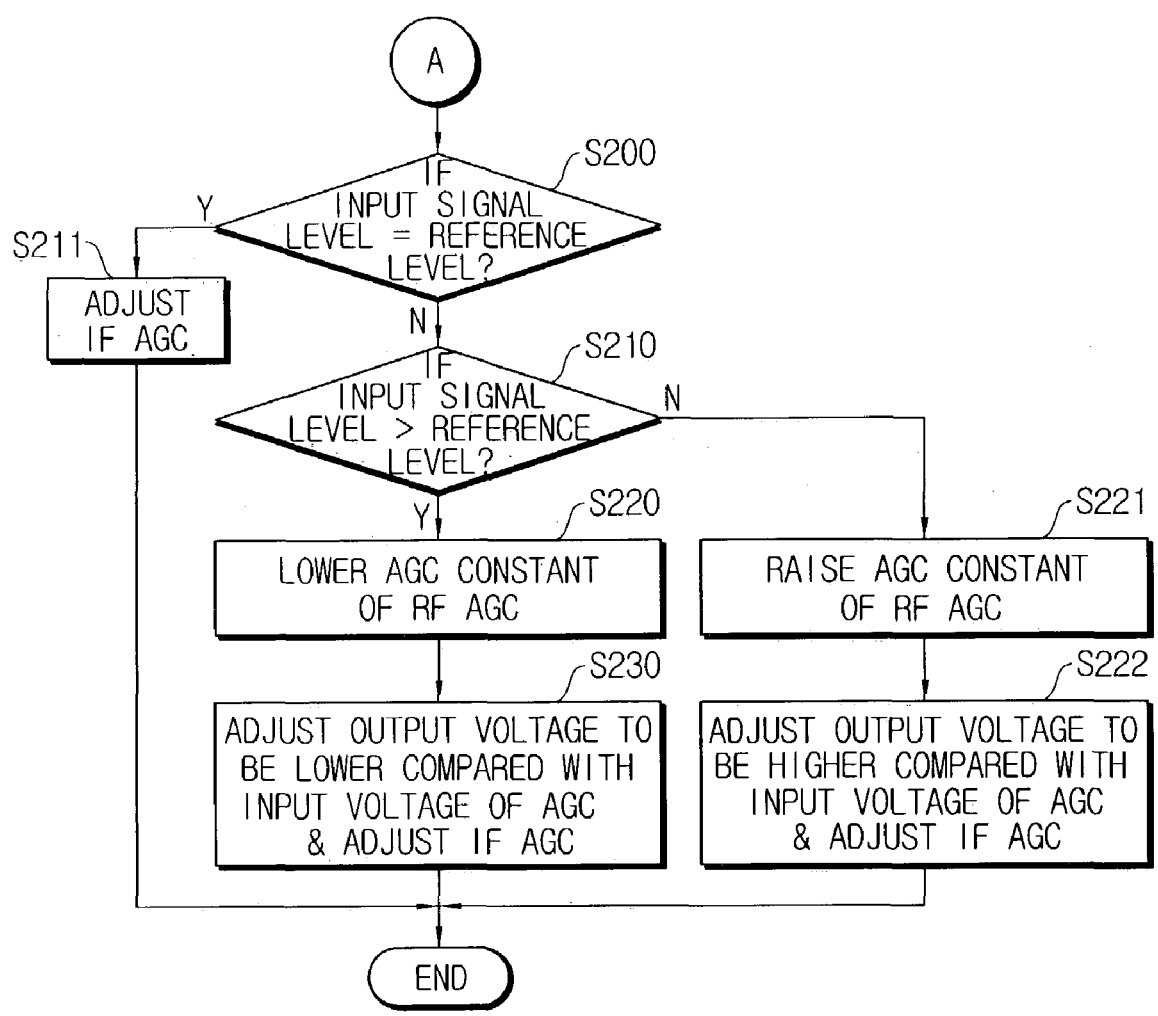

FIGS. 4A and 4B are flowcharts illustrating an adjusting method of an automatic gain control apparatus according to the present invention.

As described above, the RF AGC compensating unit 39 detects an input level of the IF signal input to the IF amplifier 35, and adjusts the RF AGC voltage to a predetermined level.

More specifically, the RF AGC compensating unit 39 determines whether or not the reproduced image signal meets the '1 Vpp' condition (S100), and if it is determined not, the RF AGC compensating unit 39 determines whether or not the reproduced image signal exceeds '1 Vpp' (S110).

If it is determined that the reproduced image signal does not exceed '1 Vpp', the RF AGC compensating unit 39 determines whether or not the IF input signal level is identical to the reference level (S120).

If it is determined that the IF input signal level is different from the reference level, the RF AGC compensating unit 39 determines if the IF input signal level is smaller or greater than the reference level (S130). If it is determined that the IF input signal level is greater, the RF AGC compensating unit 39 lowers the AGC constant of the RF AGC 38, thereby causing the output voltage to be lower compared with input voltage of the RF AGC 38 (S140, S150).

If it is determined in S120 that the IF input signal level is identical to the reference level, the IF AGC 37 is adjusted (S131).

If it is determined that the reference level is greater in S130, it is adjusted such that the AGC constant of the RF AGC 38 is increased and the output voltage of the RF AGC 38 compared with the input voltage is subsequently increased (S141, S151).

If it is determined in S110 that the reproduced image signal exceeds '1 Vpp', it is determined whether or not the IF input signal level is identical to the reference level (S200).

If it is determined that the IF input signal level is not identical to the reference level, it is determined if the IF input signal level is smaller or greater than the reference level (S210). If it is determined that the IF input signal level is greater, the AGC constant of the RF AGC 38 is decreased to cause the output voltage of the RF AGC 38 to be lower compared with the input voltage, and the AGC constant of the IF AGC 37 is adjusted (S220, S230).

If it is determined in S200 that the IF input signal level is identical to the reference level, the IF AGC 37 is adjusted (S211).

If it is determined in S210 that the reference level is greater, the AGC constant of the RF AGC 38 is increased to cause the output voltage of the RF AGC 38 to be higher compared with the input voltage, and the AGC constant of the IF AGC 37 is adjusted (S221, S222).

According to such automatic gain control apparatus for a video signal, a malfunction of an AGC possibly generated at an AGC of a related art, could be eliminated.

Further, adjustment of an AGC level upon production is not required, whereby productivity is improved.

Still further, in case that an AGC constant is changed due to a malfunction of a pre-filter or a SAW filter, the AGC level is automatically adjusted, whereby optimum image quality could be always maintained.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An automatic gain control apparatus for a video signal comprising:
   - a RF amplifier for receiving signals of a frequency band from a predetermined channel, and amplifying a high frequency signal among those received signals and converting the high frequency signal into an intermediate frequency (IF) signal;
   - an IF amplifier for receiving the intermediate frequency signal, and amplifying the signal by a predetermined amplifying rate;
   - a demodulator for demodulating the IF signal from the IF amplifier, and outputting a reproduced video signal;
   - a RF automatic gain control apparatus and an IF automatic gain control apparatus for receiving the video signal reproduced by the demodulator, and controlling a gain of the RF amplifier and a gain of the IF amplifier according to the reproduced video signal, respectively; and
   - a RF automatic gain control compensating unit for detecting a level of an IF input signal provided to the IF amplifier, checking whether the detected level of the IF input signal meets a reference level, controlling for raising a voltage of the RF automatic gain control apparatus if the detected level of the IF input signal is lower than the reference level, and controlling for lowering a voltage of the RF automatic gain control apparatus if the detected level of the IF input signal is higher than the reference level.

2. The apparatus according to claim 1, wherein if the reproduced video signal is smaller than an output reference range and when the level of the IF input signal is lower than the reference level, the RF automatic gain control apparatus raises an AGC constant associated with the RF automatic gain control apparatus, thereby making an output voltage higher compared with an input voltage of the RF automatic gain control apparatus.

3. The apparatus according to claim 1, wherein in the case that the reproduced video signal is smaller than an output reference range and that the level of the IF input signal meets the reference level, the IF automatic gain control apparatus is adjusted.

4. The apparatus according to claim 1, wherein if the reproduced video signal is smaller than an output reference range and the level of the IF input signal is higher than the reference level, the RF automatic gain control apparatus lowers an AGC constant associated with the RF automatic gain control apparatus, thereby making an output voltage lower compared with an input voltage of the RF automatic gain control apparatus.

5. The apparatus according to claim 1, wherein if the reproduced video signal exceeds an output reference range, the IF automatic gain control apparatus adjusts an AGC constant associated with the IF automatic gain control apparatus.

6. The apparatus according to claim 1, wherein if the reproduced video signal exceeds an output reference range and the level of the IF input signal is lower than the reference level, the RF automatic gain control apparatus raises an AGC constant associated with the RF automatic gain control apparatus, thereby making an output voltage higher compared with an input voltage of the RF automatic gain control apparatus, and adjusting an AGC constant of the IF automatic gain control apparatus.

7. The apparatus according to claim 1, wherein if the reproduced video signal exceeds an output reference range and the level of the IF input signal is higher than the reference level, the RF automatic gain control apparatus lowers an AGC constant associated with the RF automatic gain control apparatus, thereby forming an output voltage lower compared with an input voltage of the RF automatic gain control apparatus, and an AGC constant of the IF automatic gain control apparatus is adjusted.

8. An adjusting method of an automatic gain control apparatus for a video signal for being inputted with a signal, amplifying the input signal through a RF amplifier and outputting as an IF input signal to an IF amplifier, outputting a video signal which is reproduced based on the IF input signal, and controlling a gain of the RF amplifier and of the IF amplifier based on the reproduced video signal through a RF automatic gain control apparatus and an IF automatic gain control apparatus, respectively, the adjusting method comprising the steps of:

(a) determining whether or not the reproduced video signal meets a predetermined output reference range;

(b) if it is determined that the reproduced video signal does not meet the predetermined output reference range in the step (a), determining whether or not the reproduced video signal exceeds the predetermined output reference range;

(c) if it is determined that the reproduced video signal does not exceeds the predetermined output reference range in the step (b), determining whether or not an IF input signal level of the IF input signal is identical to a reference level that corresponds to the output reference range;

(d) if it is determined that the IF input signal level is not identical to the reference level in the step (c), determining if the IF input signal level is greater or smaller than the reference level; and (e) if it is determined that the IF input signal level is greater than the reference level in the step (d), lowering an AGC constant of the RF automatic gain control apparatus, thereby making an output voltage lower compared with an input voltage of the RF automatic gain control apparatus.

9. The adjusting method of claim 8, wherein, if it is determined in the step (c) that the IF input signal level is identical to the reference level, the IF automatic gain control apparatus is adjusted.

10. The adjusting method of claim 8, wherein, it is determined in the step (d) that the reference level is greater, the AGC constant of the RF automatic gain control apparatus is raised so that the output voltage becomes higher compared with the input voltage of the RF automatic gain control apparatus.

11. The adjusting method of claim 8, if it is determined in the step (b) that the reproduced video signal exceeds the output reference range, further comprising the steps of:

(f) determining whether or not the IF input signal level is identical to the reference level;

(g) if it is determined in the step (f) that the IF input signal level is not identical to the reference level, determining if the IF input signal level is greater or smaller than the reference level; and (h) if it is determined in the step (g) that the IF input signal level is greater, lowering the AGC constant of the RF automatic gain control apparatus, thereby making the output voltage lower compared with the input voltage of the RF automatic gain control apparatus, and adjusting an AGC constant of the IF automatic gain control apparatus.

12. The adjusting method of claim 11, wherein, if it is determined in the step (f) that the IF input signal level is identical to the reference level, the IF automatic gain control apparatus is adjusted.

13. The adjusting method of claim 11, wherein, if it is determined in the step (g) that the reference level is greater, raising the AGC constant of the RF automatic gain control apparatus, thereby making the output voltage higher compared with the input voltage of the RF automatic gain control apparatus, and adjusting the AGC constant of the IF automatic gain control apparatus.

* * * * *